US00RE39992E

(19) United States
(12) Reissued Patent
Misra et al.

(10) Patent Number: US RE39,992 E
(45) **Date of Reissued Patent: *Jan. 1, 2008**

(54) MORPHING FILLERS AND THERMAL INTERFACE MATERIALS

(75) Inventors: Sanjay Misra, Shoreview, MN (US); GM Fazley Elahee, St. Paul, MN (US)

(73) Assignee: The Bergquist Company, Chanhassen, MN (US)

( * ) Notice: This patent is subject to a terminal disclaimer.

(21) Appl. No.: 11/122,210

(22) Filed: May 4, 2005

Related U.S. Patent Documents

Reissue of:
(64) Patent No.: 6,797,758
Issued: Sep. 28, 2004
Appl. No.: 09/946,879
Filed: Sep. 5, 2001

U.S. Applications:

(63) Continuation-in-part of application No. 09/543,661, filed on Apr. 5, 2000, now Pat. No. 6,339,120, and a continuation-in-part of application No. 09/690,994, filed on Oct. 17, 2000, now Pat. No. 6,624,224, and a continuation-in-part of application No. 09/865,778, filed on May 25, 2001, now Pat. No. 6,649,325.

(51) Int. Cl.
*C08K 3/08* (2006.01)

(52) U.S. Cl. ..... 524/404; 524/434; 524/439; 257/E23.106; 257/E23.107; 257/E23.109

(58) Field of Classification Search ..... None
See application file for complete search history.

(56) References Cited

U.S. PATENT DOCUMENTS

| | | | | |
|---|---|---|---|---|
| 3,226,608 | A | 12/1965 | Coffin, Jr. | |
| 3,248,615 | A | 4/1966 | Weisshaar et al. | |
| 3,793,106 | A | 2/1974 | Grunwald et al. | |
| 4,129,881 | A | 12/1978 | Reichel et al. | |
| 4,147,669 | A | 4/1979 | Shaheen et al. | |
| 4,233,103 | A | 11/1980 | Shaheen et al. | |
| 4,254,431 | A | 3/1981 | Babuka et al. | |
| 4,323,914 | A | 4/1982 | Berndlmaier et al. | |
| 4,398,975 | A | 8/1983 | Ohsawa et al. | |
| 4,520,067 | A | 5/1985 | Harris et al. | |
| 4,550,140 | A | 10/1985 | Rimsa et al. | |
| 4,764,327 | A | 8/1988 | Nozaki et al. | |
| 5,012,858 | A | 5/1991 | Natori et al. | |
| 5,024,264 | A | 6/1991 | Natori et al. | |
| 5,053,195 | A | 10/1991 | MacKay | |
| 5,056,706 | A | 10/1991 | Dolbear et al. | |
| 5,170,930 | A | 12/1992 | Dolbear et al. | |
| 5,173,256 | A | 12/1992 | Booth et al. | |
| 5,198,189 | A | 3/1993 | Booth et al. | |
| 5,225,157 | A | 7/1993 | McKay | |
| 5,328,087 | A | 7/1994 | Nelson et al. | |
| 5,445,308 | A | 8/1995 | Nelson et al. | |
| 5,529,836 | A | 6/1996 | Afzali-Ardakani et al. | |
| 5,538,789 | A | 7/1996 | Capote et al. | |
| 5,565,267 | A | 10/1996 | Capote et al. | |
| 5,827,907 | A | 10/1998 | Gotro et al. | |
| 5,958,590 | A | 9/1999 | Kang et al. | |
| 6,339,120 | B1 * | 1/2002 | Misra et al. | 524/404 |
| 6,624,224 | B1 * | 9/2003 | Misra | 524/404 |
| 6,649,325 | B1 | 11/2003 | Gundale et al. | |

FOREIGN PATENT DOCUMENTS

| | | |
|---|---|---|
| EP | 0696630 | 2/1996 |
| EP | 0708582 | 4/1996 |
| EP | 0813244 | 12/1997 |

OTHER PUBLICATIONS

IBM Technical Disclosure Bulletin, vol. 19, No. 8, Jan. 1977 "Thermal Enhancement of Modules", E.B. Hultmark et al.
IBM Technical Disclosure Bulletin, vol. 20, No. 11B, Apr. 1978, "Liquid–Metal–Cooled Integrated Circuit Module Structures", Berndlmaier et al., pp. 4817–4818.
IBM Technical Disclosure Bulletin, vol. 20, No. 11B, Apr. 1978, "Electronic Packaging Structure", Arnold et al. pp. 4820–4822.
Harman Hard Gallium Alloys for Use as Low Contact Resistance Electrodes and for Bonding Thermocouples into Samples, The Review of Scientific Instruments, Jul. 1960, vol. 31, No. 7, pp. 717–720.
IEEE Transactions on Components, Hybrids, and Mfg. Tech., vol. 13, No. 4, Dec. 1990 "Materials/Processing Approaches to Phase Stabilization of Thermally Conductive Pastes", Anderson, Jr. et al., pp. 713–717.

* cited by examiner

*Primary Examiner*—Edward J. Cain
(74) *Attorney, Agent, or Firm*—Haugen Law Firm FLLP

(57) ABSTRACT

A thermally conductive mechanically compliant pad including a quantity of gallium and/or indium alloy liquid at temperatures below about 120° C. and a boron nitride particulate solid blended into the liquid metal alloy to form a paste. The paste is then combined with a quantity of a matrix forming flowable plastic resin such as microwax, silicone wax, or other silicone polymer to form the thermally conductive mechanically compliant pad, the compliant pad comprising from between about 10% and 90% of metal alloy coated particulate, balance flowable plastic resin.

11 Claims, 5 Drawing Sheets

(METAL ALLOY DISPERSED IN POLYMER)

(PERCOLATING CLUSTERS OF CERAMIC AND METAL ALLOY)

(METAL ALLOY ONLY DISPERSION FOR SMALL AND FLAT SURFACES)

(PERCOLATING CLUSTER DISPERSIONS FOR LARGE AND/OR WARPED SURFACES)

MORPHING FILLERS AND THERMAL INTERFACE MATERIALS

Matter enclosed in heavy brackets [ ] appears in the original patent but forms no part of this reissue specification; matter printed in italics indicates the additions made by reissue.

CROSS-REFERENCE TO RELATED APPLICATIONS

The present invention is a continuation-in-part of application Ser. No. 09/543,661, filed Apr. 5, 2000, *now U.S. Pat. No. 6,339,120* entitled "METHOD OF PREPARING THERMALLY CONDUCTIVE COMPOUNDS BY LIQUID METAL BRIDGED PARTICLE CLUSTERS", and continuation-in-part application Ser. No. 09/690,994, filed Oct. 17, 2000, *now U.S. Pat. No. 6,624,224* entitled "METHOD OF PREPARING THERMALLY CONDUCTIVE COMPOUNDS BY LIQUID METAL BRIDGED PARTICLE CLUSTERS", and application Ser. No. 09/865,778, filed May 25, 2001, *now U.S. Pat. No. 6,649,325* entitled "THERMALLY CONDUCTIVE DIELECTRIC MOUNTS FOR PRINTED CIRCUITRY AND SEMICONDUCTOR DEVICES AND METHOD OF PREPARATION", all of which are assigned to the same assignee as the present invention.

BACKGROUND OF THE INVENTION

The present invention relates generally to a method of preparing thermally conductive interface materials and compounds for improving heat transfer from a heat generating semiconductor device to a heat dissipator device such as a heat sink or heat spreader. More specifically, the present invention relates to a method and/or technique for preparing a mixture of an indium alloy blended with a polymer matrix, the polymer being in the solid phase at room temperatures and with both the alloy and the polymer having a melting temperature of between about 40° C. and 120° C., preferably between about 40° C. and 100° C. These blends of metal alloy and polymer have been found to sharply reduce the thermal resistance or impedance which typically arises from a less-than-perfect contact between the boundaries or surfaces of a thermal interface positioned between the components of the assembly. More particularly, the present invention involves a process for blending a normally solid polymeric matrix with a low melting alloy of indium metal for forming an improved thermal management system for use in combination with high performance semiconductor devices.

The thermal impedance or resistance created between two components in a typical electronic thermal management assembly is increased when surface imperfections are present on the opposed surfaces of the two components. The causes of poor physical contact typically lie with macroscopic warpage of one or both surfaces, surface roughness, or other non-flat characteristics created on one or both of the opposed contact surfaces. Areas of non-intimate surface contact result in the creation of air-filled voids which are, of course, exceptionally poor conductors of heat. High thermal impedance resulting from poor thermal contact results in undesirable heating of electronic components which in turn accelerates the rate of failure of the components such as semiconductor components and comprising the assembly. Replacement of air gaps or voids with a thermally conducting medium comprising a good thermal management system has been found to sharply reduce the thermal impedance and/or resistance.

In the past, liquid metals have been proposed for incorporation in thermally conductive pastes for use with heat generating semiconductor devices. In some cases, liquid metals were not readily adapted for this purpose, primarily because of problems created with the tendency of the liquid metal to form alloys and/or amalgams, which altered or modified the thermal and other physical properties of the mounting systems. Other thermal interface materials are made by dispersing thermally conductive fillers in a polymer matrix. While most polymer matrices range in thermal conductivity from 0.1-0.2 $W\text{-}m^{-1}\text{-}K^{-}$, the properties of the fillers are quite varied. They include silica (2 $W\text{-}m^{-1}\text{-}K^{-}$), zinc oxide (10-20 $W\text{-}m^{-1}\text{-}K^{-}$), alumina (20-30 $W\text{-}m^{-1}\text{-}K^{-}$), aluminum nitride (100 $W\text{-}m^{-1}\text{-}K^{-}$), and boron nitride (200 $W\text{-}m^{-1}\text{-}K^{-}$). When placed in the thermal joint, these compounds are intended to displace air and reduce overall thermal impedance. Addition of thermally conductive fillers, generally consisting of fine particulates, improved the thermal conductivity of the compound filling the voids.

In our copending application Ser. No. 09/543,661, a number of low melting alloys are disclosed which are highly effective for use as thermal interfaces in thermal management systems for enhancement of percolation of thermal energy. The present invention provides additional advantages in thermal interfaces through the use of certain selected polymer matrices for retention of the low melting alloy, the matrices having melting points which are also low and, preferably, relatively close to the melting points of the retained alloys. These polymers as well as the alloys are in solid phase at room temperature, and this feature facilitates ease of handling of the thermal interface particularly during production and use.

In accordance with the present invention, improved interface materials have been developed based on incorporation of low melting alloys as fillers capable of altering their shape in response to heat and pressure. At room temperature, these fillers are in solid phase, as is the polymer matrix, with this combination of features facilitating ease of handling. In addition, these morphing fillers respond to heat and pressure by their ability to flow into and fill air gaps or voids that may be present in the matrix, thereby avoiding creation of standoff or poor particle-to-particle contact (see FIG. 2).

In those applications where the opposed surface areas are small, or alternatively are relatively flat, interfaces having thin cross-sections may be employed. Typically, in such applications, those dispersions utilizing only polymeric matrices having dispersed low melting alloys function well (see FIG. 3). For interfaces employing a laterally disposed mechanical standoff, or those subject to large warpage, it is normally desirable to utilize highly thermally conductive particulate fillers in combinations with the low melting alloys in order to create large heat percolating clusters (see for example FIG. 4).

SUMMARY OF THE INVENTION

In accordance with the present invention, an indium-containing alloy is selected which is in the solid phase at room temperature, while having a melt temperature of between about 40° C. and 120° C. The alloy is then subjected to a size reduction operation—typically by emulsifying, while in molten phase, in the polymer matrix of interest. A surface active agent may be added during the emulsification to enhance the rheological properties and dispersion stability. Alternatively, the size reduction of the metal alloy may be accomplished by blow or impact, or alternatively by grinding or abrasion, under cryogenic conditions. Depending upon the particular type of equipment and conditions under which the particulate is formed, it may be possible to add the surface active agent to the working material while undergoing size reduction process. The metallic powder can then be blended with a quantity of a matrix polymer which is likewise in the solid phase at room temperature, having a melt point of between about 40° and 100° C. to form a compliant pad. The polymer matrix is preferably selected from the group consisting of paraffin, microwax, and silicone waxes. The low melting alloy may also be blended with a particulate filler such as, for example, boron nitride or alumina with the resultant mixture being mechanically agitated in the presence of a compatible wetting agent to form a stable dispersion for ultimate blending with the polymer matrix.

It should be noted that while the melt temperatures for the polymer matrix and the metal alloy are both indicated as being between about 40° C. and 120° C., it is desirable that a differential be maintained between the actual melt temperatures. For example, it has been found desirable to select a polymer matrix having a melting temperature which is approximately 10° C. lower than that of the metal alloy. Other differential relationships may also be useful. While certain other metal alloys may be found useful, indium-based alloys are generally preferred for utilization in the present invention.

The physical properties of thermal interface compounds prepared in accordance with the present invention are such that conventional production handling techniques may be employed during assembly operations. In this connection, the compounds may be handled or formed into an interface device by stamping or they may be printed directly onto heat-transfer surfaces. Alternatively, they may be made into tapes that can be die-cut so as to be later applied directly onto the heat transfer surfaces.

Therefore, it is a primary object of the present invention to provide compositions of materials useful as thermal interface compounds, wherein a low melting metallic alloy is retained within a polymer matrix, and wherein each of these components is in the solid phase at room temperature, and has a melting temperature of between about 40° C. and 120° C. and preferably between about 40° C. and 100° C.

It is a further object of the present invention to provide an improved combination of components utilized to form a composition which is useful as thermal interface compounds, and wherein hard particulate fillers such as boron nitride and/or alumina may be employed in combination with an indium alloy, and thereafter blended into and retained within a polymeric matrix.

It is yet a further object of the present invention to provide an improved thermal interface compound which is dry and solid at room temperature, and which changes to liquid phase at moderately elevated temperatures, thereby permitting the compounds to be easily handled utilizing conventional handling techniques and yet respond effectively in a thermal management application.

Other and further objects of the present invention will become apparent to those skilled in the art upon a study of the following specification, appended claims, and accompanying drawings.

IN THE DRAWINGS

Figure 8:
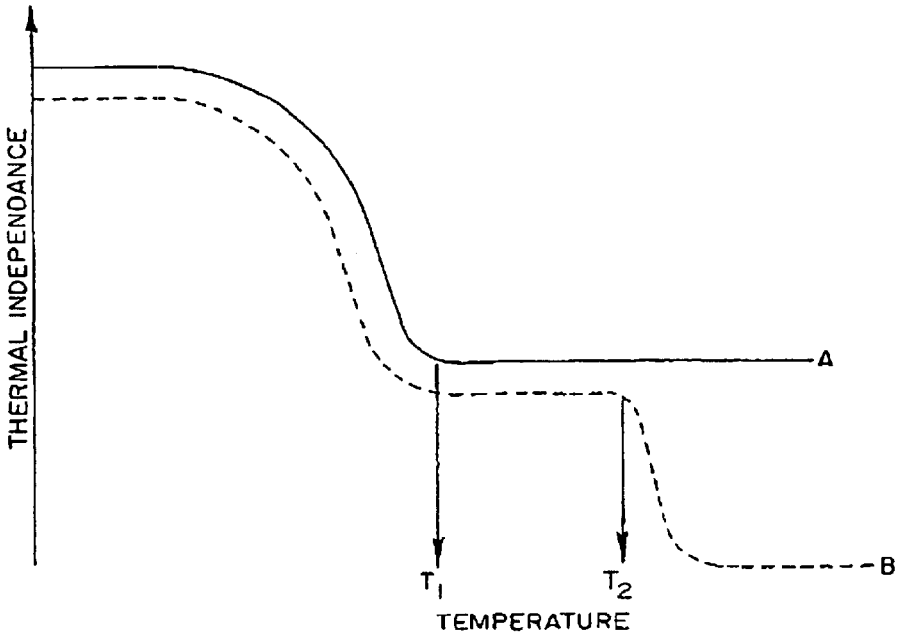
Figure 9:
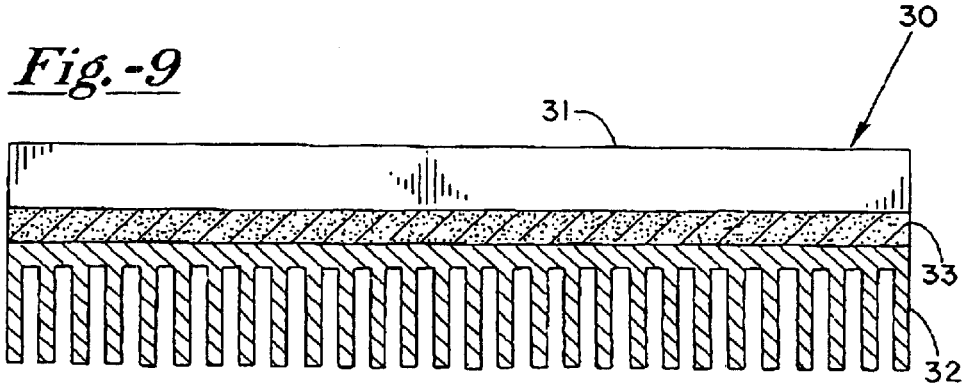

FIG. 8 is a graph demonstrating the change in thermal impedance versus temperature for the metal alloy and polymeric components of phase-change interface materials prepared in accordance with the present invention; and FIG. 9 is an illustration of a typical semiconductor mounted on a finned heat sink, and having the thermal interface of the present invention interposed between opposed surfaces of the semiconductor device and the heat sink.

DESCRIPTION OF THE PREFERRED EMBODIMENTS

In carrying out the steps of the present invention, an indium-containing alloy is initially selected with this alloy having a melt temperature of between about 40° C. and 100° C., it being understood that alloys having melt temperatures of up to about 120° C. may also find application. Preferably, the low melting indium alloy comprises indium alloys containing quantities of bismuth, tin, and/or zinc as set forth below.

The selected indium alloy is subjected to an emulsification step wherein the metal is reduced to a finely divided form. It is preferred that the metal alloy be reduced to particles which average about 1-100 μm in diameter. The size reduction or emulsification may be undertaken in a high shear mixer, with the addition of a compatible surface active agent at a point in this step.

Following size reduction, the metal particulate is blended with a polymer, with the blend being subsequently cured to form the polymeric matrix retainer. Alternatively, the materials may be compounded in liquid state creating an emulsion with metal droplets dispersed in the polymer.

Specific Preferred Embodiments

In order to describe the preferred embodiments, the following examples are given:

TABLE I

Alloys which are prepared for use in the present invention having the composition and melting points as follows:

| Alloy | Indium (%) | Bismuth (%) | Sn (%) | Zinc (%) | Melting Point (° C. |
|---|---|---|---|---|---|
| 1 | 51 | 32.5 | 16.5 | 0 | 60 |
| 2 | 66.3 | 33.7 | 0 | 0 | 70 |
| 3 | 26 | 57 | 17 | 0 | 79 |
| 4 | 52.2 | 0 | 46 | 1.8 | 108 |

Surface Active Agents

As surface active agents, silanes, titanates, zirconates and/or assorted surface active agents are preferred to improve rheology and stability of the dispersion, and particularly for creating a hydrophobic barrier. Surface treatments with surface active agents that work well for improving rheology as well as stability of the dispersion, especially against moisture, are alkyl functional silanes, such as for example octyl triethoxy silane (OTES). Another example is methyltrimethoxy (MTMS) silane. These silanes bind to the oxides on the surface of the metal particles, creating a durable hydrophobic barrier. Additionally, these silanes compatibilize the particles with the polymer matrix and reduce particle aggregation.

The following compositions have been prepared, with numbers being by weight:

TABLE II

| | Matrix | | Alloy 1 | | 40 μm Boron Nitride | | OTES | |
|---|---|---|---|---|---|---|---|---|
| Formula | Parts by weight | Vol % | Parts by weight | Vol % | Parts by weight | Vol % | Parts by weight | Vol % |
| 1 | 100[1] | 30 | 1200 | 52 | 100 | 15 | 12 | 3 |
| 2 | 100[1] | 34 | 1000 | 48 | 83 | 14 | 10 | 4 |
| 3 | 100[1] | 35 | 1200 | 61 | 0 | 0 | 12 | 4 |
| 4 | 100[1] | 40 | 1000 | 56 | 0 | 0 | 10 | 4 |
| 5 | 100[2] | 35 | 1200 | 61 | 0 | 0 | 12 | 4 |
| 6 | 100[3] | 30 | 1200 | 52 | 100 | 15 | 12 | 3 |

[1]silicone wax consisting of siloxane backbones with pendant alkyl chains and having a melting point of 60° C.
[2]microwax, melting point 60° C.
[3]soft silicone polymer consisting of a reactive siloxane elastomer.

Typical properties of the formulations are set forth in Table III:

TABLE III

| Formula | Thermal Conductivity (W/m-K) | Thermal Impedance[4] (K-cm$^2$/W |
|---|---|---|
| 1 | >7 | 0.25 |
| 2 | 5.0 | 0.20 |
| 3 | 1.8 | 0.20 |
| 6 | >7 | 0.25 |

[4]ASTM D5470, flat surfaces, no mechanical standoff.

Thermal Management Applications

Compounds prepared pursuant to the formulations of Table III are varied. Formulations 3, 4 and 5, in particular, may be applied as coatings by typical coating techniques including hot stamp, screen printing, or applied to the heat transfer surface directly by other means. These coatings will typically have a cross-sectional thickness of less than about 10 mils.

For coatings of larger cross-section, those formulations containing a particulate filler, such as Formulations 1, 2 and 6 may find particular application. These coatings may be applied to carriers such as glass or polymer fabrics, plastic films or metal foils. When supported, the coatings may be handled with ease, thereby facilitating their use in production.

Heat Transfer Modes

For those applications which require intimate contact, i.e., where the contact line is desired to be as thin as possible, Formula 3 is recommended, although those of Formula 4 and 5 are highly suited as well. In each event, the metal droplet will deform completely so as to reduce contact resistance without increasing standoff. See for example the demonstrative dispersions illustrated in FIG. 5.

For those applications requiring mechanical, standoff, formulations pursuant to Formula 1 are well suited, it being noted that this formulation has highly desirable thermal conductive properties. In addition, the metal droplets present in the formulation will continue to function for reduction of contact resistance, while portions of the metallic component will be present in larger percolating clusters for enhanced transfer of thermal energy. See, for example, the demonstrative percolating cluster dispersions of FIG. 6.

Device Application

With attention now being directed to FIG. 9 of the drawings, a thermal interface is prepared pursuant to any one selected formulation of Formulas 1 through 6 of Table II, with a thermal interface so prepared being employed in combination with a heat generating semiconductor device of conventional configuration. Accordingly, the assembly 30 shown in FIG. 9, includes a heat generating semiconductor device or package illustrated at 31 having a heat sink, heat spreader, or other finned heat dissipating member illustrated at 32. Interposed between the opposed surfaces of semiconductor device 31 and heat dissipating member 32 is a mechanically compliant thermally conductive interface 33, prepared in accordance with the present invention.

Figure 7:
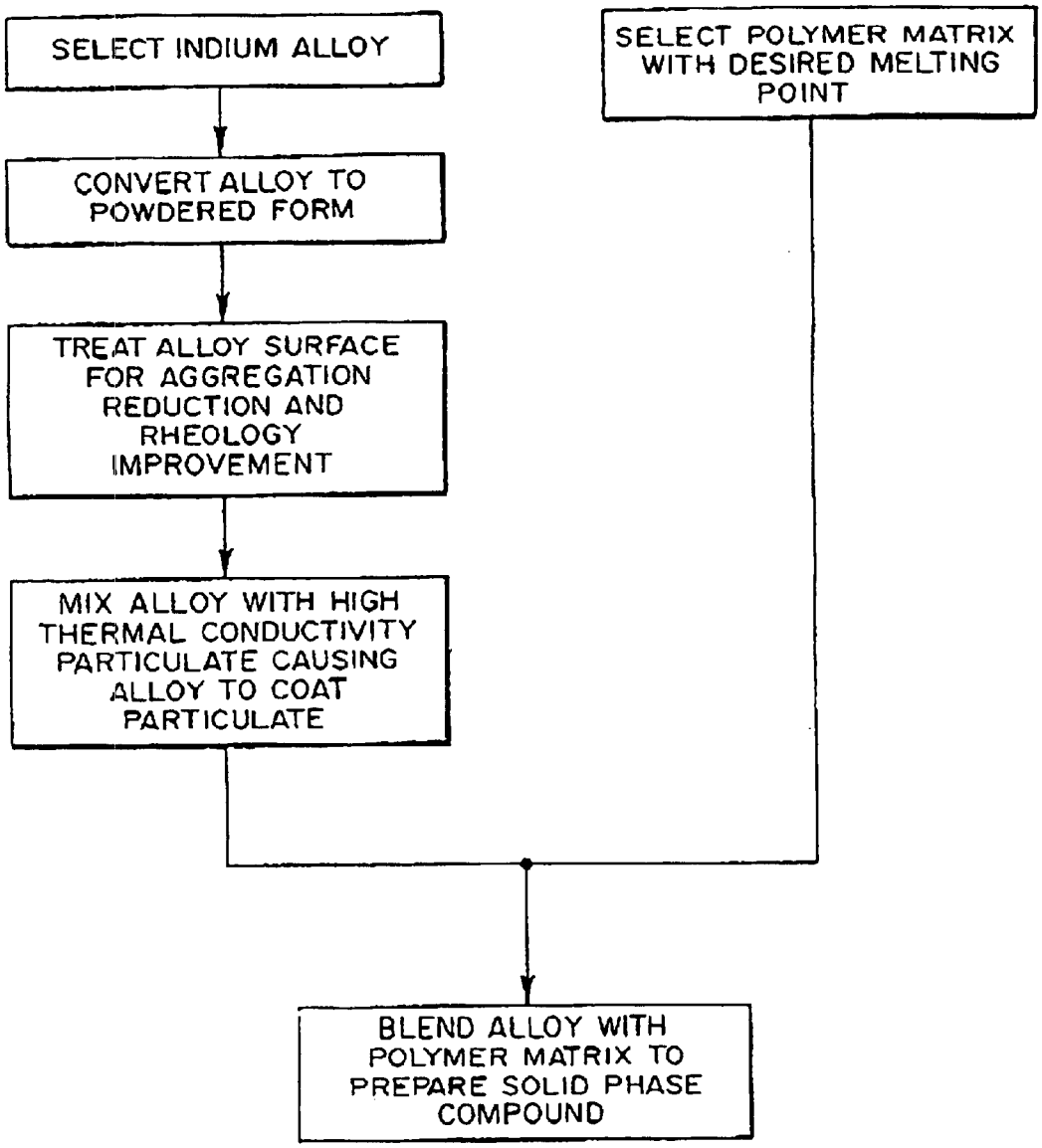
FIG. 7 is a flow diagram illustrating the steps involved in a typical operation for preparing thermal interface devices in accordance with the present invention.

FIG. 7 is a flow diagram setting forth the steps typically undertaken in accordance with the creation of thermally conductive interfaces in accordance with the present invention. As indicated, and as is apparent from the flow diagram, the alloy/particulate mixture is blended until the surfaces of the particulate are thoroughly wetted with a surface active agent, and thereafter an alloy/particulate/matrix formulation is prepared through the addition to a selected polymer, preferably one which is heated to a highly flowable condition or in the "B" stage of cure.

Typical Preparation Operation

As indicated above, FIG. 7 is a flow chart illustrating the steps undertaken in preparing the thermal interfaces of the present invention commencing with the initial milling of the indium alloy, and identifying the steps that follow.

Conversion of Alloy to Powdered Form

The preferred method is emulsification of the metal in molten form. This can either be done in-situ in the polymer matrix of interest or in another liquid medium, followed by separation and purification of the powder. Utilizing typical operating parameters, the powdered alloy is available in sizes ranging up to about 100 microns.

Surface Treatment

Surface treatment includes, preferably, the addition of a surface active agent such as, for example, octyl triethoxy silane (OTES) or methyl triethoxy silane (MTMS). These silanes bind to the oxides which readily form of the surface of the metallic particles to create a hydrophobic barrier. Additionally, they compatibilize the particles with the polymer matrix and reduce particle aggregation. Alternatively, or additionally, titanates or zirconates such as, for example, the barium or calcium salt forms, may be used.

Blending with Thermally Conductive Particulate

As indicated hereinabove, particulate materials such as boron nitride and alumina may typically be employed to improve the thermal conductivity and stability of the blend. These particulate components may be present in a range up to about 15% by volume, although blends containing up to about 50% by volume may be employed successfully. When blended, the alloy coats the particulate, with the blending operation being undertaken with the alloy in the liquid phase.

The Polymer Matrix

As indicated, the polymer matrix is preferably selected from paraffin, microwax, and silicone waxes comprising alkyl silicones. For most purposes microwax having a melting point of about 50-60° C. has been found particularly suited for this application. As indicated above, it is generally desirable to utilize a polymer matrix which undergoes a phase change at a temperature of about 10° C. lower than the phase change temperature of the alloy.

Blending Alloy with Polymer Matrix

It is generally preferred that this step by undertaken with both components in the liquid phase. As such, the materials are blended in a high shear mixer until the metal becomes thoroughly dispersed in the polymer, at which time it may be formed into the configuration desired for the thermal interface. Conventional techniques for preparing the coating may be utilized, with this operation being compatible with most liquid phase treatment operations.

Properties of Thermal Interfaces

Figure 1:
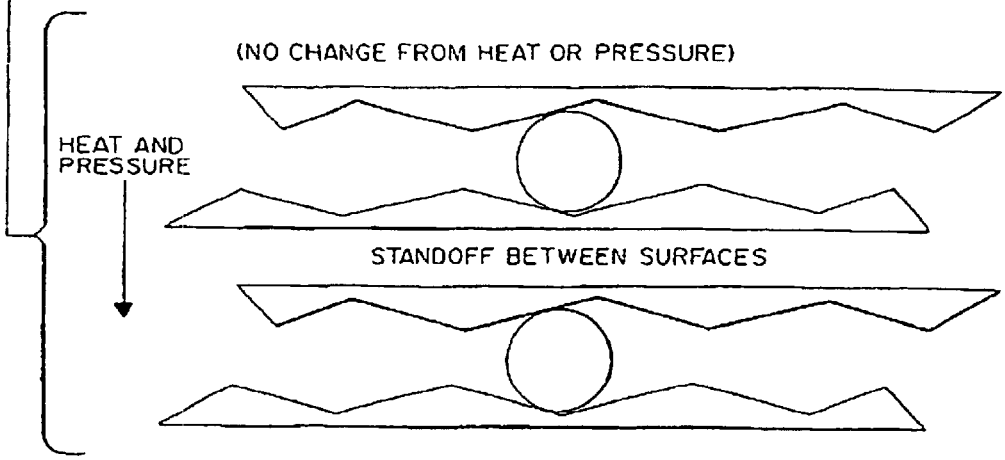
Fig.-1 (PRIOR ART)
FIG. 1 is a demonstrative display of the performance of a prior art thermal interface utilizing a hard particulate within a conventional polymeric matrix, and demonstrating the non-responsive or non-compliant nature of the combination when subjected to the application of heat and pressure.

As illustrated in FIG. 1, prior art thermal interfaces utilizing hard particulate within a conventional hard or firm polymeric matrix lacks the ability to flow under heat and pressure, and therefore results in a standoff between the adjacent or opposed surfaces.

Figure 2:
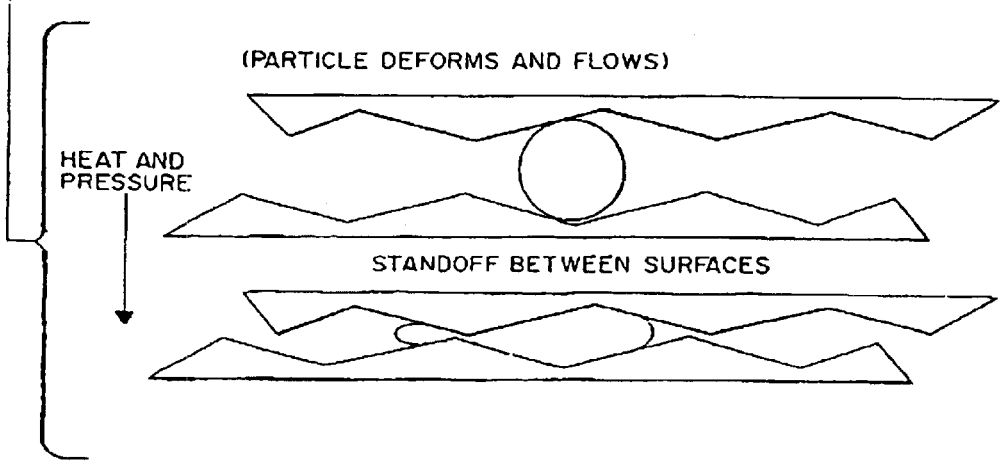
FIG. 2 is a view similar to FIG. 1 illustrating the response of a low melting point alloy within a conventional polymeric matrix, and showing the response when subjected to the application of heat and pressure.

FIG. 2 illustrates the performance and activity when a phase change filler is employed in a polymeric matrix, with the filler deforming and modifying its configuration under heat and pressure, thereby permitting the opposed surfaces to mate.

Figure 3:
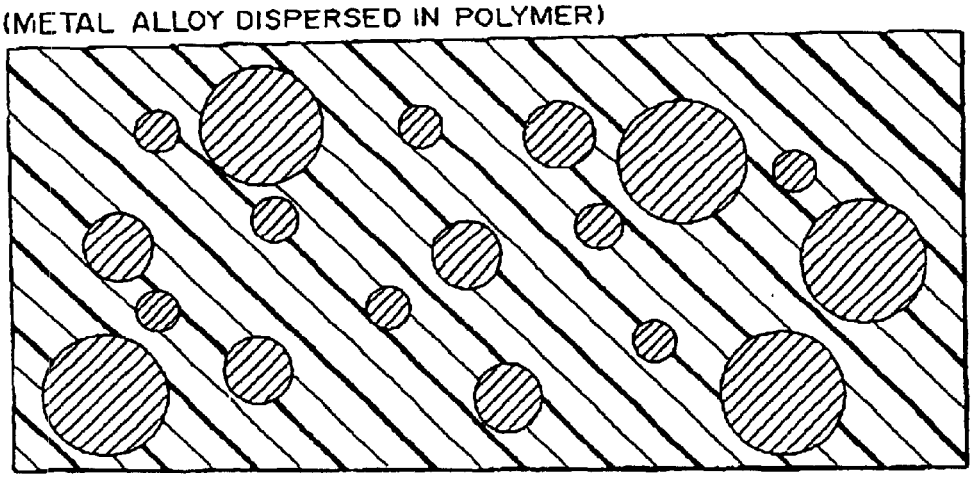
FIG. 3 is a demonstrative sketch illustrating a metal alloy dispersed within a conventional polymeric matrix.

FIG. 3 demonstrates the dispersal of metal alloy particles within a polymer, with the configuration of the particulate being determined primarily by surface tension phenomena.

Figure 4:
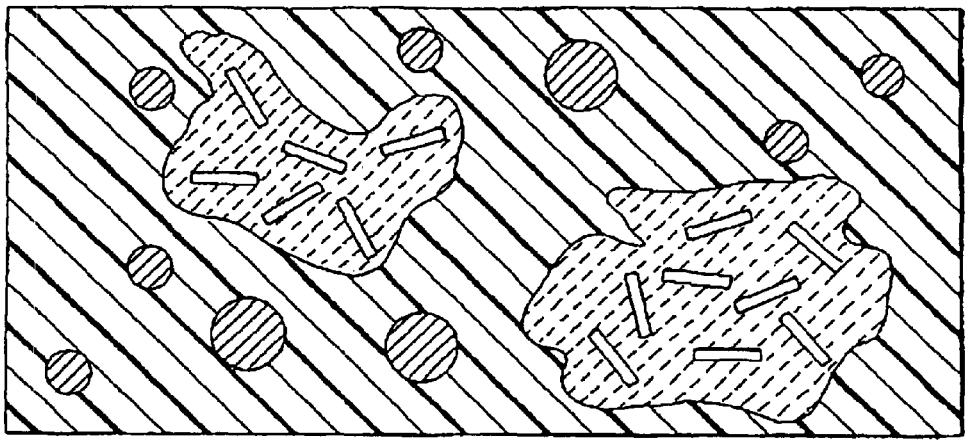
FIG. 4 is a demonstrative sketch illustrating the arrangement of percolating clusters of a metal alloy in which a thermally conducting inorganic particulate is dispersed, with the alloy/particulate clusters being in turn disposed within a polymeric matrix.

With reference to FIG. 4, this figure demonstrates the presence of percolating clusters of inorganic particulate such as boron nitride confined within metal alloy, with the percolating effect being achieved through the merger of various individual particulate.

Figure 5:
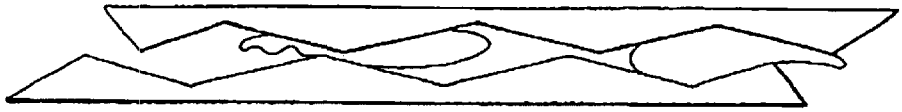
FIG. 5 is a demonstrative sketch illustrating a low melting point alloy dispersed within a polymeric matrix and designed for accommodating surface areas which are small and/or flat and which lie between a heat generating semiconductor device and a heat sink.

With attention being directed to FIG. 5, this figure demonstrates the utilization of a low melting metal alloy as a dispersion for small and flat surfaces, it being noted that the metal alloy conforms under the influence of heat and pressure to enhance the contact areas.

Figure 6:
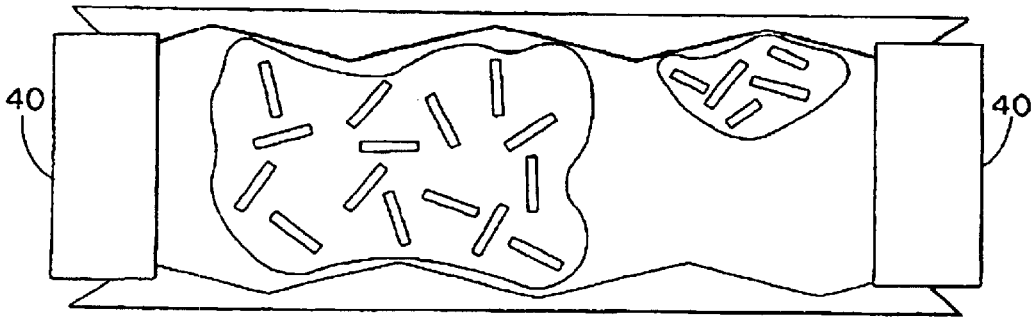
FIG. 6 is a demonstrative sketch illustrating a percolating cluster of low melting point metal alloy blended with particulate, and held in place within a laterally disposed mechanical standoff for application as a thermal interface between surfaces of large warpage, it being noted that the presence of high thermal conductivity fillers assists in the creation of large heat percolating clusters.

With reference to FIG. 6, it will be observed that a percolating cluster of dispersions of metal alloy/inorganic particulate retained within the confines of laterally dispersed mechanical standoff elements 40-40 in order to accommodate larger area surfaces or those subject to large warpage.

With attention now being directed to FIG. 8 of the drawings, it will be noted that the curves illustrate the performance and properties of the polymer taken together with the metal alloy component in a typical thermal interface. As indicated, the phase change for the metal alloy component occurs at a temperature approximately 10° higher than that for the polymeric matrix. This has been found to be a workable arrangement with respect to temperature differentials pursuant to the present invention.

General Commentary

Boron nitride or alumina particulate preferably ranges in size from about 1 micron and up to about 40 microns in diameter or cross-sectional thickness. It will be observed that the platelet-like configuration of boron nitride in particular provides a highly desirable configuration and combination when wetted with liquid metal. The effective boron nitride particle is illustrated in FIG. 4 of the drawings. Viscosity control is also aided by this feature or property of boron nitride.

One silicone wax utilized in the formulations of the examples is GP-533 (M.P. of 60° C.) (Genesee Polymer of Flint, Mich.), with these materials being, of course, commercially available. A microwax employed is M-7332 (M.P. of 55° C.) (Moore and Munger of Shelton, Conn.). Another polymer matrix used is a one-part soft reactive silicone elastomer (GE Toshiba Silicones of Tokyo, Japan).

One unusual and unexpected property or feature of formulations of the present invention is the electrical resistivity. When Formulation 1 is formed in a pad of thickness of 3-5 mils and interposed between opposed surfaces of a semiconductor device and a heat sink, the electrical resistivity of the pad has been found to be highly significant, having a value of up to about $10^{12}$ Ω·cm (Formulation 1, Table II).

It will be appreciated that the above examples are given for purposes of illustration only and are not to be otherwise construed as a limitation upon the scope of the following appended claims.

What is claimed is:

1. A method of preparing thermally conductive mechanically compliant pads comprising the steps of:

(a) selecting a quantity of an indium containing alloy which has a melt temperature of between about 40° C. and 120° C.

(b) treating said alloy to cause dispersal into divided form;

(c) combining said dispersed alloy with a compatible surface active agent and thermally conductive particles and blended to form a paste; and (d) combining said dispersed alloy containing paste with a quantity of a flowable plastic resin material to form a thermally conductive mechanically compliant pad with said thermally conductive mechanically compliant pad comprising from between about 10% and 90% by volume of the combined dispersed metal alloy and thermally conductive particulate, balance flowable plastic resin.

2. The method of claim 1 wherein the particles making up said thermally conductive particulate solid have a diameter of between about 1 and 40 microns.

3. The method of claim 1 wherein said liquid alloy substantially encapsulates said thermally conductive particles to form a coating thereon, and wherein the liquid metal to thermally conductive particle volume ratio is at least 3:1.

4. The method of claim 1 wherein said blended paste is further blended with microwax or silicone wax to form a conformable pad, with the pad comprising between about 10% and 90% by volume of homogeneous paste, balance microwax or silicone wax.

5. The method of claim 1 being particularly characterized in that said liquid metal alloy is in liquid state at temperatures above 60° C.

6. The compliant thermally conductive pad prepared in accordance with the steps of claim 1.

*7. A method of preparing thermally conductive mechanically compliant pads comprising the steps of:*

*(a) selecting a quantity of an indium containing alloy which has a melt temperature of between about 40° C. and 120° C.;*

*(b) treating said alloy to cause dispersal into divided form;*

*(c) combining said dispersed alloy with thermally conductive particles and blending the combination to form a paste; and*

*(d) combining said dispersed alloy containing paste with a quantity of a flowable plastic resin material to form a thermally conductive mechanically compliant pad with said thermally conductive mechanically compliant pad comprising between about 10% and 90% by volume of the combined dispersed metal alloy and thermally conductive particulate, balance flowable plastic resin.*

*8. A thermally conductive electrically-resistive mechanically compliant pad comprising a mixture of:*

*(a) between about 10% and 90% by volume of a paste, which paste includes a blend of:*

*(i) an indium containing alloy having a melt temperature of between about 40° C. and 120° C.;*

*(ii) thermally conductive particles, at least a portion thereof being dispersed within at least a portion of said indium containing alloy; and*

*(b) balance flowable plastic resin.*

*9. A thermally conductive electrically-resistive mechanically compliant pad comprising:*

*(a) an indium containing alloy having a melt temperature of between about 40° C. and 120° C., and being in divided particulate form of between about 1 and 100 μm in diameter; and*

*(b) a polymeric resin material having a melt temperature of between about 40° C. and 120° C.*

*10. A thermally conductive mechanically compliant pad as in claim 9, including a compatible surface active agent.*

*11. A thermally conductive mechanically compliant pad as in claim 9 wherein the melt temperature of said polymeric resin material is about 10° C. lower than the melt temperature of said indium containing alloy.*

* * * * *